United States Patent [19]

Wiener

[11] 4,356,347
[45] Oct. 26, 1982

[54] INTEGRATED STYLUS ARRAY FOR PRINTER OPERATION

[75] Inventor: Patricia P. Wiener, La Honda, Calif.

[73] Assignee: Xerox Corporation, Stamford, Conn.

[21] Appl. No.: 181,330

[22] Filed: Aug. 25, 1980

[51] Int. Cl.³ .............................................. H04N 1/24
[52] U.S. Cl. ..................................... 178/30; 346/154; 358/296
[58] Field of Search ................... 178/2 R, 3, 15, 23 R, 178/30; 340/700, 706, 711, 718, 719, 732, 789, 794, 798, 800; 346/153.1, 154; 358/286, 293, 300, 296

[56] References Cited

U.S. PATENT DOCUMENTS

| | | | |
|---|---|---|---|
| 3,444,319 | 5/1969 | Artzt et al. | 178/30 |
| 3,952,153 | 4/1976 | Nijenhuis et al. | 178/30 |
| 3,991,868 | 11/1976 | Robinson et al. | 197/1 R |
| 4,117,518 | 9/1978 | Skala | 346/154 |
| 4,176,362 | 11/1979 | Nelson | 346/74.1 |

Primary Examiner—Thomas A. Robinson
Attorney, Agent, or Firm—Frederick E. McMullen

[57] ABSTRACT

A solid state multiple mode stylus array capable of printing, copying, or transmission, the various operating components of which are integrally formed on a substrate to provide a monolithic device. The array components include plural printing styli arranged in one or more rows to form a printing array; a shift register, the output of successive shift register stages being coupled to successive styli, the shift register having input and output ports for the receipt and discharge of image pixels; plural scanning elements arranged in one or more rows to form a scanning array for scanning images and producing image pixels representative thereof, the output of successive scanning elements being coupled to the input of successive shift register stages; clock means for driving the shift register; and control means for selectively routing image pixels from either the input port or the scanning array to one of the printing array or the output port, or both.

20 Claims, 8 Drawing Figures (PRINT MODE)

(DATA TRANSMIT MODE)

INTEGRATED STYLUS ARRAY FOR PRINTER OPERATION

This invention relates to a stylus array of the type used with printers and the like, and more particularly to an improved multi-mode, monolithic stylus array.

Conventional stylus arrays have a multiplicity of individual styli arranged in one or more rows to produce images in response to image signals input thereto. However, to obtain adequate image resolution, a substantial number of closely spaced styli are required. Indeed, in some applications, resolution requirements may result in as many as 2000 styli being used in a single stylus array.

Further, conventional stylus arrays are normally capable of operating in a single mode, i.e. a print mode. Here, as will be understood, the styli serve to selectively deposit electrical charges on a suitable imaging material such as a dielectric web of paper, a photoconductor, etc. in accordance with image signals or pixels addressed to the individual styli that comprise the array. The resulting image charge pattern is developed i.e. rendered visible, through the electrostatic attraction between the developing material and the charged image. Following development, the resulting image may be rendered permanent as by fusing in a known manner.

As noted, however, stylus arrays of the aforedescribed type are not normally capable of performing other operational tasks as for example, reading as by scanning document originals to permit, where desired, immediate printing or copying of the document original through the use of the associated styli. Instead, conventional stylus arrays must rely on outside devices such as scanners, memories, etc. as the source of image pixels. And, of course, conventional stylus arrays cannot serve as a source of image pixels for use by other stylus arrays, nor as conduits for image pixels where printing is not desired.

Contemporary stylus arrays are normally hand wired with individual styli supported on a suitable substrate material. The image signals are distributed to the individual styli through wires. This results, particularly in the case where large numbers of styli are used to give high image resolution, in a stylus wiring harness having a plethora of wires leading to it. And while efforts toward reducing this wiring complexity have been made, notably through matrix switching, the problem has at best been only partially alleviated.

The invention relates to a multiple function solid state array capable of printing using image pixels input from a remote source, or of copying using image pixels derived by scanning document originals, or of transmitting image pixels input from the remote source or derived by scanning to a remote output, comprising in combination; a printing array having plural printing styli arranged in at least one row; a shift register for distributing image pixels in parallel to the printing array, the shift register having a serial data input port for input of image pixels from a remote source to the shift register and a serial data output port for output of image pixels in serial form to a remote output; clock means for driving the shift register to clock the image pixels along the shift register for output to the printing array or to the serial data output port; an imaging array with plural scanning elements arranged in at least one row, the imaging array providing image pixels representative of the document original scanned in parallel form to the shift register for input to the printing array directly or to the serial output data port for output to the remote output source; and means for operating the shift register to distribute image pixels received from either the serial data input port or the imaging array to either the printing array, or the serial data output port, or both.

The invention further relates to a method of printing, copying or transmitting data through a monolithic stylus array comprising the steps of: segregating an incoming serial stream of image pixels into lines and applying each successive line of image pixels to printing styli to print the image represented by the image pixels line by line; routing the image pixels directly to the stylus array output by passing the printing styli when transmitting data; scanning an image to produce image pixels and applying successive lines of image pixels derived by scanning to the printing styli to provide a copy of the image scanned; and converting the lines of image pixels derived by scanning to a serial stream and routing the serial stream of image pixels directly to the stylus array output when transmitting image pixels derived by scanning.

In the drawings

Figure 1:
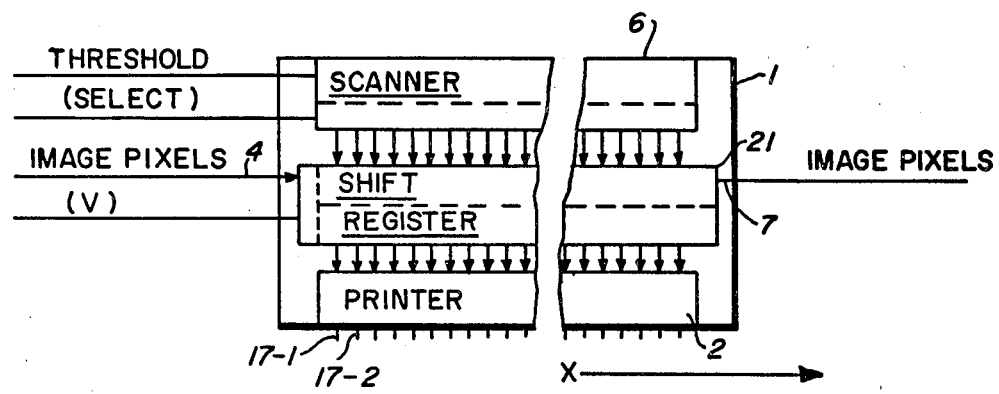
FIG. 1 is a block diagram of the multiple mode solid state stylus array of the present invention.

Referring to FIGS. 1 through 4 of the drawings, there is shown the stylus array 1 of the present invention. As will appear, array 1 includes a printer 2 comprised of a plurality of styli 17-1, 17-2, ... 17-N along one side or face thereof, operable in a PRINT mode to print images on a suitable printing medium 3 in response to image signals or pixels input thereto from a remote source via the array serial data input port 4. In addition, the stylus array may also operate in a COPY mode to print images of document originals 5 on printing medium 3 in response to image signals generated by an integral SCANNER 6, in a DATA TRANSMIT mode to transmit the serial stream of image pixels input via port 4 to serial data output port 7, and in a COPY TRANSMIT mode to transmit image pixels produced by scanner 6 to serial data output port 7. As will appear, stylus array 1 converts the serial stream of image pixels input via serial data input port 4 to parallel format for use by styli 17-1, 17-2 ... 17-N of printer 2 when in the PRINT mode, and converts parallel image pixels produced by scanning array 6 to a serial stream of image pixels for output via serial data output port 7 when operating in the COPY TRANSMIT mode.

It will be understood that suitable driving means (not shown) are provided to establish scanning movement between stylus array 1 and printing medium 3 during the PRINT and COPY Modes. Printing medium 3 may, for example, comprise any suitable dielectric material such as paper on which a discrete charge pattern conforming to the image pixels input to styli 17-1, 17-2, ... 17-N of printer 2 is produced during operation of stylus array 1 in PRINT or COPY modes. The dielectric material may, thereafter, be brought into operative contact with a suitable developing medium which is selectively attracted thereto in accordance with the charge pattern to produce a visible rendition of the image. The developed image may thereafter be fixed to form a permanent reproduction or copy of the image.

As a further example, printing medium 3 may comprise a photoconductor of a xerographic type copying apparatus. In that application, styli 17-1, 17-2, . . . 17-N produce a charge differential on the previously uniformly charged surface of the photoconductor in accordance with the image pixels input thereto. The resulting latent electrostatic image is thereafter developed, transferred to a suitable copy substrate material such as paper, and fused to form a permanent copy in the manner known to those skilled in the xerographic arts.

Serial data input port 4 may be coupled to any suitable source of image pixels such as the bit structuring apparatus described in co-pending application Ser. No. 181,332, filed on Aug. 25, 1980, in the name of Patricia Phyllis Wiener, a CRT, a keyboard, a data communication line, a mass storage media, a computer, another scanning device or devices, facsimile, and the like. Similarly, serial data output port may serve any suitable remote user such as a data transmission line, a mass storage, a CRT, another printing device, etc.

Preferably, the dimension of stylus array 1 along the longitudinal axis thereof (i.e., the X axis) is sufficient to span printing medium 3 along one dimension (i.e. the width), with styli 17-1, 17-2, . . . 17-N of printer 2 arranged in a row extending thereacross. The row of styli 17-1, 17-2, . . . 17-N is preferably of sufficient length to permit one line of image pixels to be printed at a time with a total number of styli sufficient to provide desired image resolution commensurate with the dimensional limitations in fabricating stylus array 1. While a single row of styli 17-1, 17-2, . . . 17-N, is shown, plural rows of styli may be contemplated.

Figure 2A:
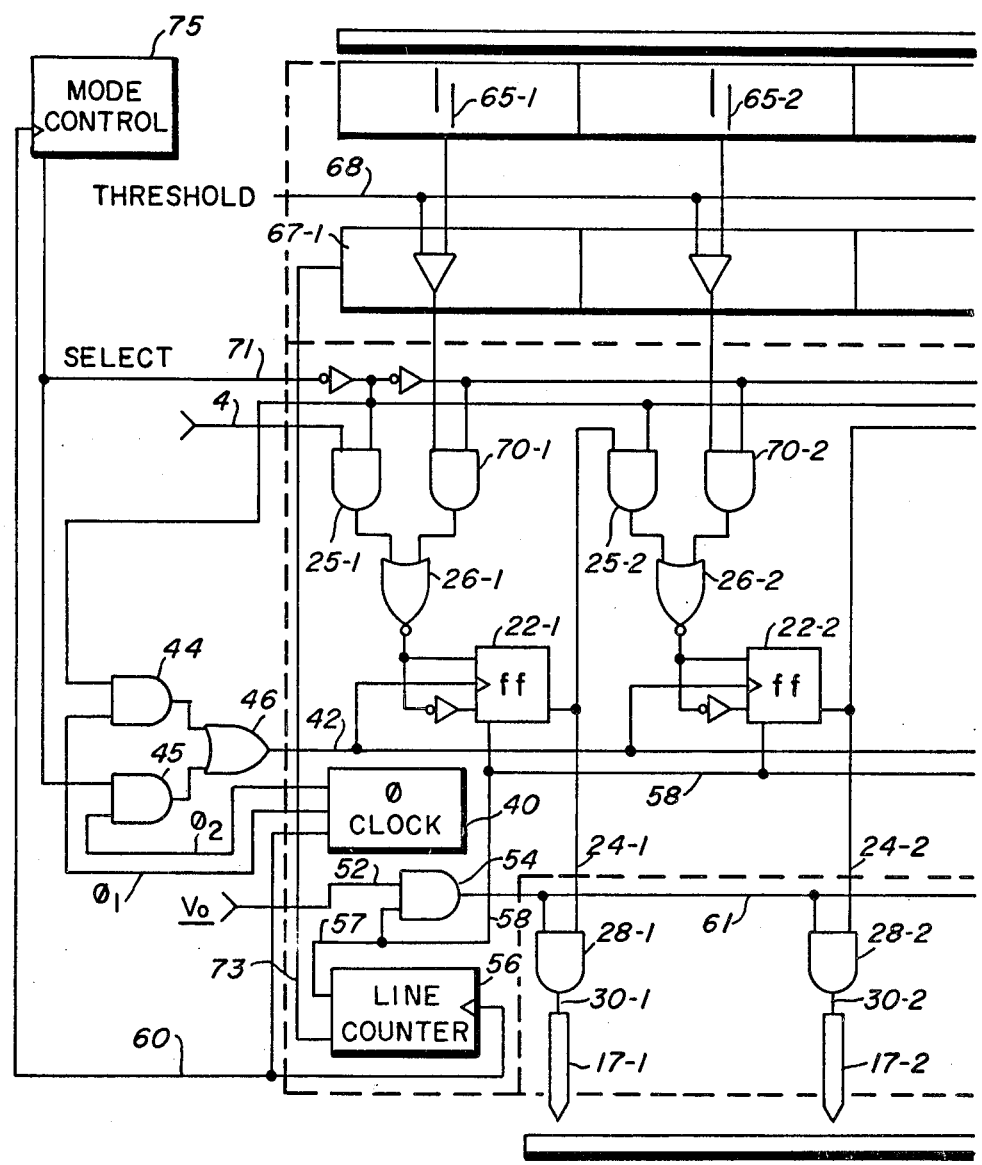
FIGS. 2A and 2B are a circuit schematic illustrating the image signal distributing circuit for the stylus array shown in FIG. 1.
Figure 2B:
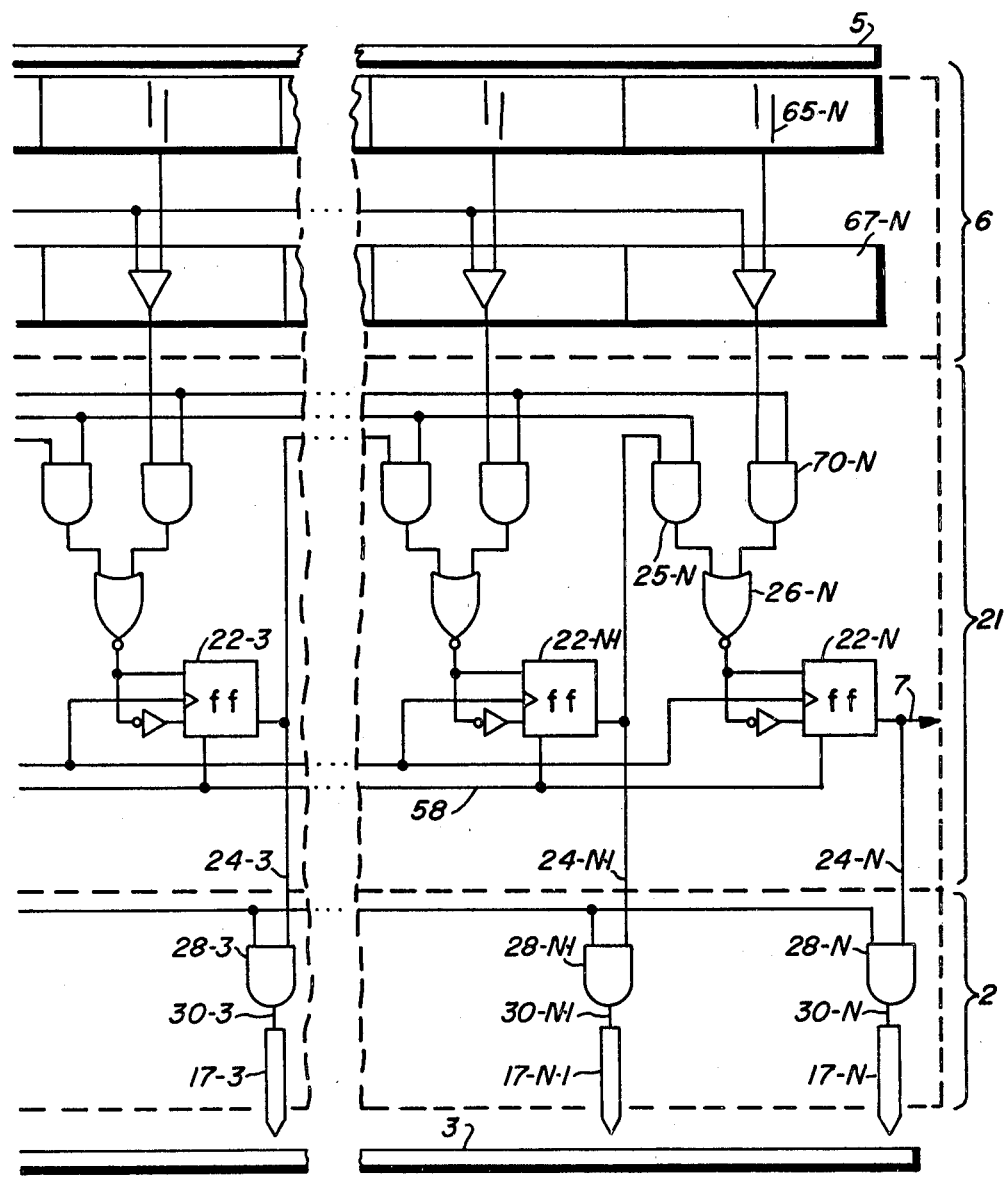

Referring particularly to FIGS. 2A and 2B, stylus array 1 includes a serial/parallel in-serial/parallel out shift register buffer 21 composed of a succession of flip-flops 22-1, 22-2, . . . 22-N, there being one flip-flop associated with each stylus 17-1, 17-2, . . . 17-N of printer 2. Leads 24-1, 24-2, . . . 24-N couple the output side of shift register flip-flops 22-1, 22-2, . . . 22-N to one input of AND function power gates 28-1, 28-2, . . . 28-N. The outputs of power gates 28-1, 28-2, . . . 28-N are coupled by leads 30-1, 30-2, . . . 30-N to styli 17-1, 17-2, . . . 17-N.

Serial data input port 4 is coupled to the data input terminal of the shift register flip-flop 22-1 through AND function serial data input gate 25-1 and OR function gate 26-1. The output of each successive flip-flop 22-1, 22-2 . . . 22-N-1 is coupled through serial data input gates 25-2, 25-3, . . . 25-N and OR gates 26-2, 26-3, . . . 26-N to the data input terminals of succeeding shift register flip-flops 22-2, 22-3, . . . 22-N. Serial data output port 7 is coupled to the output terminal of the last flip-flop 22-N through lead 24N.

A suitable clock 40 provides clock signals $\phi_1$, $\phi_2$ to stylus array 1 through AND function serial and parallel clock gates 44, 45 and OR function gate 46. As will appear, a SELECT signal controls enablement of gates 44, 45 in accordance with the operational mode selected. Clock lead 42 feeds clock pulses to the clock terminal of each flip-flop 22-1, 22-2 . . . 22-N.

A suitable source of power $V_o$ for operating styli 17-1, 17-2, . . . 17-N, (not shown) is coupled to AND function input power gate 54 through lead 52. A line counter 56 is provided. The output of counter 56 is coupled by lead 57 to one input of input power gate 54 and through lead 58 to the CLEAR terminal of flip-flops 22-1, 22-2, . . . 22-N. Clock lead 60 feeds clock pulses to the clock input of line counter 56 while lead 61 couples the output of input power gate 54 to the array power gates 28-1, 28-2, . . . 28-N.

In PRINT Mode, where image pixels are input via serial data input port 4, line counter 56, following a count equal to the number of flip-flops 22-1, 22-2 . . . 22-N in shift register 21 (i.e., an image line) enables input power gate 54 for a predetermined interval to provide a pulse (POWER) of preset duration in lead 61 to array power gates 28-1, 28-2, 28-N as will appear. A signal in lead 58 on the falling edge of the power pulse clears flip-flops 22-1, 22-2, . . . 22-N.

Scanner 6 includes a succession or array of photosensors 65-1, 65-2, . . . 65-N, as for example photodiodes, disposed in a row on an axis parallel to the longitudinal axis of stylus array 1 along a second side or face of the array 1. Photosensors 65-1, 65-2, . . . 65-N serve to scan a document original 5 line by line to provide image pixels representative of the document image areas viewed. In the exemplary arrangement shown, the number of photosensors 65-1, 65-2, . . . 65-N of scanning array 6 is equal to the number of styli 17-1, 17-2, . . . 17-N of printer 2. And while photosensors 65-1, 65-2, . . . 65-N are illustrated as being disposed in a single row, plural rows of photosensors may instead be contemplated. Additionally, the number of photosensors may be less than the number of styli 17-1, 17-2, . . . 17-N. In that event, suitable interpolator means may be envisioned to increase the number of image pixels to a number commensurate with the number of printing styli.

It will be understood by those skilled in the art that a suitable lamp or lamps (not shown) may be provided to illuminate at least the portion of the document original 5 being scanned, with suitable optical means (not shown) for focusing scanner 6 on the document original. Additionally, suitable drive means (not shown) are provided to establish scanning movement between stylus array 1 and the document original being scanned.

Photosensors 65-1, 65-2, . . . 65-N, on exposure to the document original generate analog image signals, the voltage level of which is representative of the amount of incident light reflected from the area of the document original viewed by each photosensor. Analog image signals from photosensors 65-1, 65-2, . . . 65-N are input to detector array 67-1, 67-2, . . . 67-N where the analog image signals are compared with a preset threshold signal (THRESHOLD) introduced through lead 68 over a given INTEGRATION period to produce binary level (i.e., "1" or "0") image pixels. Image pixels from detector array 67-1, 67-2, . . . 67-N are input through AND function parallel data input gates 70-1, 70-2, . . . 70-N and OR gates 26-1, 26-2, . . . 26-N to shift register 21 on enablement of gates 70-1, 70-2, . . . 70-N by a SELECT signal in lead 71.

The INTEGRATION signal for scanner 6 may be conveniently derived from counter 56, lead 73 serving to input the INTEGRATION signal to the detector array section of scanner 6.

Mode control 75 permits the user or operator to select the operational mode desired, i.e., PRINT, COPY, DATA TRANSMIT, or COPY TRANSMIT. The control signal output of mode control, identified herein as the SELECT signal, is output through lead 71 to shift register 21. Clock lead 60 inputs clock pulses from clock 40 to mode control 75 to correlate the SELECT signal with the operational mode selected.

While a binary thresholding circuit has been described, other types of thresholding circuits may be envisioned, as for example a thresholding circuit operating in an adaptive mode and acting in concert with a nearest neighbor(s) to implement line thinning, edge detection, color changes, and the like, or operating with a nearest neighbor(s) to detect gray scale, etc.

OPERATION

Figure 3A:
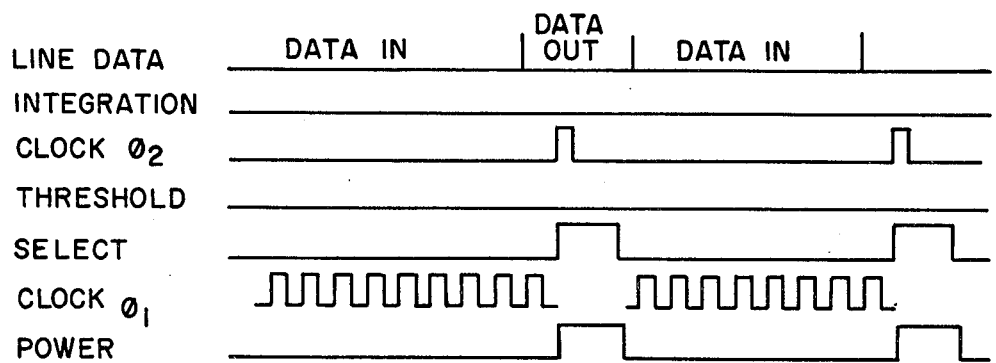
FIGS. 3A, 3B, 3C and 3D are diagrams illustrating the operational sequences of the stylus array for various operational modes.

Referring particularly to FIGS. 2A, 2B, and 3A, in PRINT Mode operation, the SELECT signal is low setting shift register 21 for serial in/serial out operation and enabling data input gates 25-1, 25-2, . . . 25-N and clock gate 44. Image pixels are input to shift register 21 through serial data input port 4 one line at a time, the pixels passing through gates 25-1, 26-1 to the first flip-flop 22-1 of shift register 21. In this operational mode, scanner 6 in inactive and the image pixels originate from any suitable external source as described heretofore. The leading edge of clock pulses $\phi_1$ from clock 40 shifts the first image pixel, which for example may be low, to the output side of flip-flop 22-1 and the input of the next flip-flop, i.e. flip-flop 22-2. On the next succeeding clock pulse, the first image pixel is shifted through flip-flop 22-2 to the input of the next succeeding flip-flop 22-3 while the next or second image pixel, which for example may be high, is shifted through flip-flop 22-1 to the input of flip-flop 22-2. Accordingly, the output of flip-flop 22-2 is now low, while the output of flip-flop 22-1 is high.

The above procedure continues with succeeding image pixels shifted successively from one flip-flop of shift register 21 to the next until the entire line of image data is loaded into the shift register.

As the image pixels are clocked into shift register 21, line counter 56 is indexed with each clock pulse $\phi_1$. At a preset count representing the last image pixel in the line of image data, the SELECT signal goes high, switching shift register 21 from series to parallel operation. On clock pulse $\phi_2$, the line of image pixels are transferred from the input side of the shift register flip-flops 22-1, 22-2, . . . 22-N to the flip-flop output sides. A signal from counter 56 triggers input power gate 54 for a preset count to provide power through lead 61 at the array power gates 28-1, 28-2, . . . , 28-N. Where the signal level at the output side of flip-flops 22-1, 22-2, . . . 22-N is high, power is transmitted to the styli coupled thereto. Where the signal output level is low, transmission of power to the styli coupled thereto is precluded and the styli remain in a quiescent state.

On the falling edge of the POWER pulse a signal in lead 58 clears flip-flops 22-1, 22-2, . . . 22-N for the next line of image signals. At the same time, an enabling signal may be output to the data source to initiate input of fresh image pixels to shift register 21.

Figure 3B:
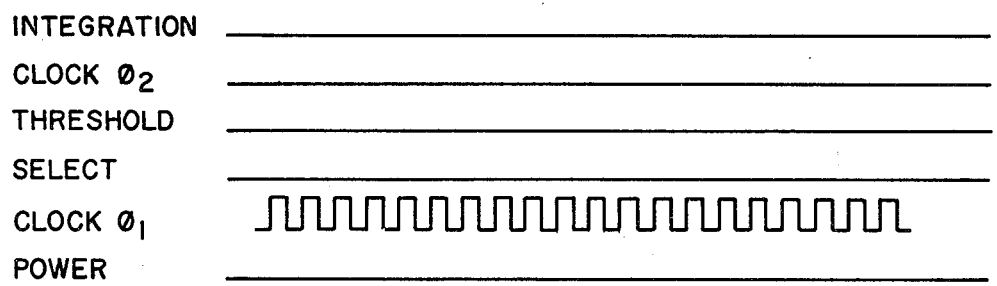

Referring particularly to FIG. 3B, in the DATA TRANSMIT mode, the SELECT signal sets shift register 21 for serial operation and enables serial data input gates 25-1, 25-2, . . . 25-N and clock gate 44 as described above. Image pixels from an external source are input via serial data input port 4 and gates 25-1, 26-1 to shift register 21. Clock pulses $\phi_1$ from clock 40 shift the image pixels through successive shift register flip-flops 22-1, 22-2, . . . 22-N to serial data output port 7 and a remote user of the type described heretofore. In this mode of operation, scanner 6 is inactive and where printing is not desired, printer 2 as well.

Figure 3C:
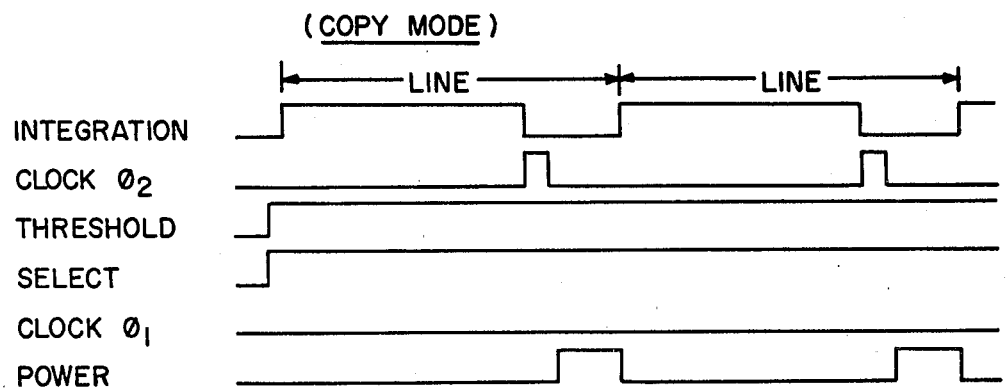

Referring particularly to FIG. 3C, in the COPY mode, both printer 2 and scanner 6 are activated. In this mode of operation, the SELECT signal is high to operate shift register 21 in the parallel in/parallel out mode. At the same time, gates 70-1, 70-2, . . . 70-N are enabled to permit parallel input of image signals from scanner 6 to shift register 21.

Scanner 6 continuously scans the document original 5 to produce analog image signals, the voltage level of which is representative of the document image area viewed. During a timed INTEGRATION pulse, the image signals produced by photosensors 65-1, 65-2, . . . 65-N of scanner 6 are compared to the preset threshold level (THRESHOLD) input via lead 68 to produce binary level image pixels representative of the document areas viewed by scanner 6. The threshold image pixels are input through gates 70-1, 70-2, 70-N and 26-1, 26-2, 26-N to the input side of shift register flip-flops 22-1, 22-2, . . . 22-N. On clock pulse $\phi_2$ the image pixels are shifted to the output side of flip-flops 22-1, 22-2, . . . 22-N and applied to gates 28-1, 28-2, . . . 28-N. Styli 17-1, 17-2, . . . 17-N of printer 2 are activated in accordance therewith on a POWER pulse from counter 56 in the manner described heretofore. Following printing of the image pixels, the shift register 21 is cleared.

Figure 3D:
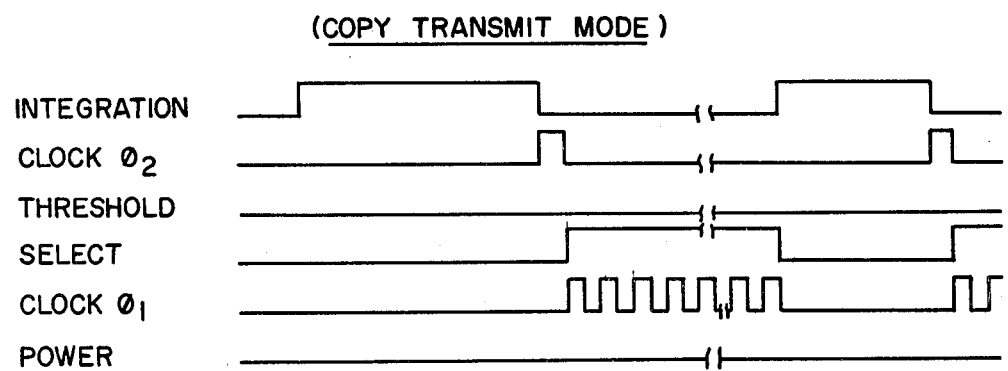

Referring particularly to FIG. 3D, in the COPY TRANSMIT Mode, image pixels are generated by scanner 6 in the manner described and loaded into shift register 21. Following loading of shift register 21, a SELECT signal switches shift register 21 from parallel to series operation. The image pixels are clocked serially along shift register 21 to serial data discharge port 7 and the remote user. During this mode of operation, printer 2 is inactive where copying of the images scanned is not desired.

Figure 4:
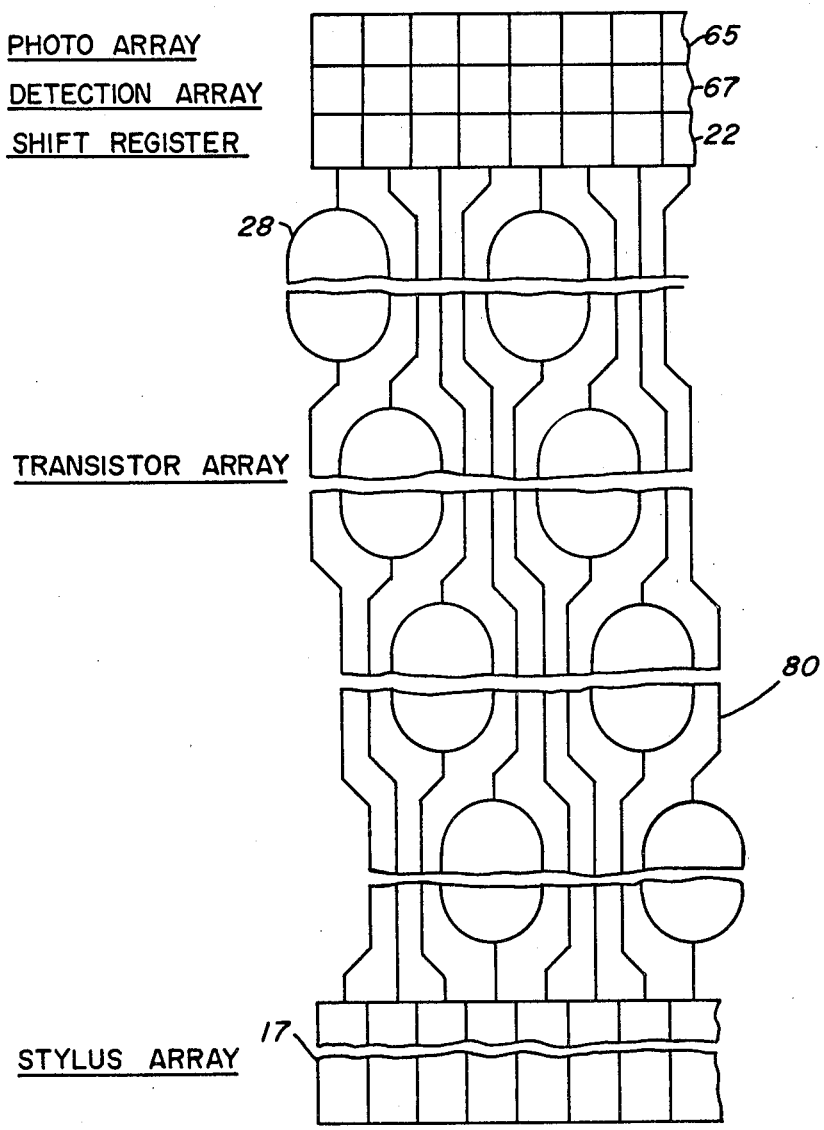
FIG. 4 is plan view showing the electrode pattern for the construction of the monolithic stylus array of the present invention.

The operating components that comprise stylus array 1 are preferably integrated on a single chip or substrate to form a monolithic device. Referring particularly to FIG. 4 of the drawings, an exemplary chip layout for monolithic integration of the stylus array drivers, photodetector array, register, thresholding/switching circuits, stylus, etc. on a silicon substrate 80 is there shown. Other layouts and substrate materials, i.e. sapphire, or silicon, may be contemplated, together with various packaging materials, i.e. ceramic, plastic, etc. to provide a monolithic stylus array.

While the invention has been described with reference to the structure disclosed, it is not confined to the details set forth, but is intended to cover such modifications or changes as may come within the scope of the following claims.

I claim:

1. A solid state multi-mode printing array comprising in combination:
    (a) multiple printing styli forming at least one printing array;
    (b) multiple stage buffering means for buffering image pixels, the output of successive stages of said buffering means being coupled to successive ones of said printing styli,
    said buffering means having input and output ports for serial input and output of image pixels to and from said buffering means;
    (c) clock means for driving said buffering means to clock image pixels through said buffering means; and (d) mode means for routing said image pixels from said input port through said buffering means to one of said printing array and said output port.

2. The solid state printing array according to claim 1 including:
multiple scanning elements forming at least one scanning array for scanning images and producing image pixels representative of the images scanned, successive ones of said scanning elements being coupled to the input of successive ones of said buffering means stages to input image pixels to said buffering means from images scanned;
said mode means selectively routing image pixels from said scanning array to one of said printing array and said buffering means output port.

3. The solid state printing array according to claim 2 in which said scanning array produces analog image signals representative of the images scanned by said scanning array scanning elements, and
thresholding means for changing said analog image signals from said scanning array to binary level image pixels for input to said buffering means.

4. The solid state printing array according to claim 1 including:
a source of power for operating said printing styli, and
switch means for applying power from said source to printing styli enabled by said image pixels.

5. A solid state multi-mode printing array comprising in combination:
(a) multiple printing styli forming at least one printing array;
(b) multiple stage buffering means, the output of successive stages of said buffering means being coupled to successive ones of said printing styli;
(c) multiple scanning elements forming at least one scanning array for scanning images and producing image pixels representative of the images scanned; successive ones of said scanning elements being coupled to the input of successive ones of said buffering means stages to provide parallel input of image pixels to said buffering means; and
(d) clock means for driving said buffering means to clock image pixels from said scanning array through said buffering means to said printing array.

6. The solid state printing array according to claim 5 in which said buffering means has a serial output port for said image pixels; and
mode means for routing image pixels produced by said scanning array to one of said printing array and said serial output port.

7. The solid state printing array according to claim 6 in which said buffering means has a serial input port for receiving image pixels;
said mode means routing image pixels from one of said scanning array and said input port to one of said printing array and said serial output port.

8. The solid state printing array according to claim 5 in which said scanning array produces analog image signals representative of the images scanned by said scanning array scanning elements; and
thresholding means to change said analog image signals output by said scanning elements to binary level image pixels for input to said buffering means.

9. A solid state printing/copying/transmission array adapted to print images from image pixels input from a remote source or from image pixels derived by scanning document originals with said array or to discharge said image pixels to an output comprising, in combination:
(a) a printing array having plural printing styli arranged in at least one row;
(b) a shift register for distributing image pixels in parallel to said printing array, said shift register having a serial data input port for input of said image pixels from said remote source to said shift register and a serial data output port for output of said image pixels in serial form;
(c) clock means for driving said shift register to clock said image pixels along said shift register for output to said printing array or to said serial data output port;
(d) an imaging array of plural scanning elements arranged in at least one row, said imaging array providing image pixels representative of the document original scanned in parallel form to said shift register for input to said printing array directly or to said serial data output port for output; and
(e) means for selectively distributing said image pixels from one of said serial data input port and said imaging array to one of said printing array and said serial data output port.

10. The solid state array according to claim 9 including a substrate; said printing array, shift register, clock means, imaging array, and distributing means being integrated on said substrate to form a monolithic array structure.

11. The solid state array according to claim 9 in which the number of printing styli, shift register stages, and scanning elements are equal.

12. A method of printing, copying, and data transmission, comprising the steps of:
(a) for printing,
(1) segregating an incoming serial stream of image pixels into lines each comprised of a preset number of pixels, and
(2) applying the image pixels in successive lines in parallel to printing styli to print the image line represented by said image pixels;
(b) for a first data transmission;
(1) bypassing said styli and outputting said incoming stream of image pixels directly;
(c) for copying,
(1) raster scanning a document original line by line to produce image pixels representative of the original scanned, and
(2) applying said image pixels as said image pixels are produced in parallel a line at a time to said printing styli to copy the image represented by said pixels; and
(d) for second data transmission,
(1) converting said image pixels as said image pixels are produced to a serial stream of image pixels; and
(2) outputting said serial stream of image pixels directly bypassing said styli.

13. The method according to claim 12 including the step of:
thresholding image signals produced by raster scanning said document originals to provide said image pixels.

14. A solid state stylus array comprising:
(a) multiple styli forming at least one print line;
(b) a control gate for each of said styli for controlling actuation of the styli associated therewith;
(c) a flip-flop for each of said control gates;

said flip-flops being coupled in series with one another so that a line of binary level imaging signals input to the first of said flip-flops in said series may be clocked from one flip-flop to the next flip-flop in succession to load said flip-flops with said line of imaging signals;

the data output terminal of each of said flip-flops being coupled to one input of the control gate associated therewith whereby said control gates are enabled in accordance with the imaging signal content of said flip-flops;

(d) clock means for shifting imaging signals from one of said flip-flops to the next; and (e) control means effective following loading of the last of said flip-flops with said line of imaging signals to input a power pulse to said control gates to actuate those styli associated with enabled ones of said control gates.

15. The stylus array according to claim 14 in which said control means includes:

(a) gate means for regulating output of said styli power pulse to said control gates;

(b) counter means effective on a preset count representing loading of the last of said line of imaging signals in said flip-flops to enable said gate means and output of said styli power pulse to said control gates; and (c) means for indexing said counter means by said clock means.

16. The stylus array according to claim 15 in which said counter means is adapted to disable said gate means and terminate said power pulse following a preset interval.

17. The stylus array according to claim 16 including flip-flop clearing means responsive to disabling of said gate means to clear said flip-flops in preparation for the next line of imaging signals.

18. The stylus array according to claim 14 including a substrate, said styli, control gates, flip-flops, clock means, and control means being integrated on said substrate to form a monolithic array.

19. The method of distributing a line of binary level image signals to a stylus array having at least one line of styli with a row of flip-flops for receiving and distributing said image signals to individual ones of said styli, the steps of:

(a) shifting said line of image signals through said flip-flop row starting at the first flip-flop in said row and ending at the last flip-flop in said row until said line of image signals is loaded in said flip-flops;

(b) generating a power pulse for actuating said styli when loading of said flip-flops with image signals is completed; and (c) applying said power pulse to those styli associated with flip-flops holding image signals at a first signal level while blocking application of said power pulse to those styli associated with flip-flops holding signals at a second signal level.

20. The method according to claim 19 including the step of:

clearing said flip-flops in preparation for the next line of image signals following a predetermined power pulse interval.

* * * * *